United States Patent
Inada et al.

(10) Patent No.: US 11,499,224 B2
(45) Date of Patent: Nov. 15, 2022

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: KOKUSAI ELECTRIC CORPORATION, Tokyo (JP)

(72) Inventors: Tetsuaki Inada, Toyama (JP); Hideto Tateno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 168 days.

(21) Appl. No.: 16/933,009

(22) Filed: Jul. 20, 2020

(65) Prior Publication Data

US 2020/0347498 A1 Nov. 5, 2020

Related U.S. Application Data

(63) Continuation of application No. PCT/JP2018/010051, filed on Mar. 14, 2018.

(51) Int. Cl.
*C23C 16/44* (2006.01)
*C23C 16/52* (2006.01)
(Continued)

(52) U.S. Cl.
CPC .......... *C23C 16/4412* (2013.01); *C23C 16/52* (2013.01); *H01L 21/02164* (2013.01); *H01L 21/02271* (2013.01)

(58) Field of Classification Search
CPC ..... C23C 16/4412; C23C 16/52; H01L 21/67; H01L 21/02; H01L 21/67017;
(Continued)

(56) References Cited

U.S. PATENT DOCUMENTS

| | | |
|---|---|---|
| 2004/0007186 A1 | 1/2004 | Saito |
| 2014/0256160 A1 | 9/2014 | Wada et al. |
| 2016/0013053 A1 | 1/2016 | Ashihara et al. |

FOREIGN PATENT DOCUMENTS

| | | |
|---|---|---|
| JP | 08-031814 A | 2/1996 |
| JP | 2002-013500 A | 1/2002 |

(Continued)

OTHER PUBLICATIONS

Korean Office Action dated Sep. 16, 2021 for Korean Patent Application No. 10-2020-7020856.

*Primary Examiner* — Sonya McCall-Shepard
(74) *Attorney, Agent, or Firm* — Volpe Koenig

(57) ABSTRACT

A technique capable of exhausting a process gas in a wide pressure range includes a substrate processing apparatus including: a process chamber; a gas supply system configured to supply a process gas containing a compound capable of reacting with a metal; and a gas exhaust system configured to exhaust an inner atmosphere of the process chamber, wherein the gas exhaust system includes: a common exhaust piping; a first exhaust piping made of a resin incapable of reacting with the compound and whose one end is connected to the common exhaust piping via a first valve and the other end is connected to a first exhauster; and a second exhaust piping made of the metal and whose one end is connected to the common exhaust piping via a second valve and the other end is connected to a second exhauster.

14 Claims, 4 Drawing Sheets

(51) Int. Cl.
*H01L 21/02* (2006.01)
*H01L 21/67* (2006.01)

(58) Field of Classification Search
CPC ......... H01L 21/02271; H01L 21/02282; H01L 21/02164; H01L 21/02222; H01L 21/02323
See application file for complete search history.

(56) References Cited

FOREIGN PATENT DOCUMENTS

| | | | |
|---|---|---|---|
| JP | 2002-134492 | A | 5/2002 |
| KR | 10-2003-0051741 | A | 6/2003 |
| KR | 10-2014-0085516 | A | 7/2014 |
| WO | 2013/077321 | A1 | 5/2013 |
| WO | 2014/157210 | A1 | 10/2014 |

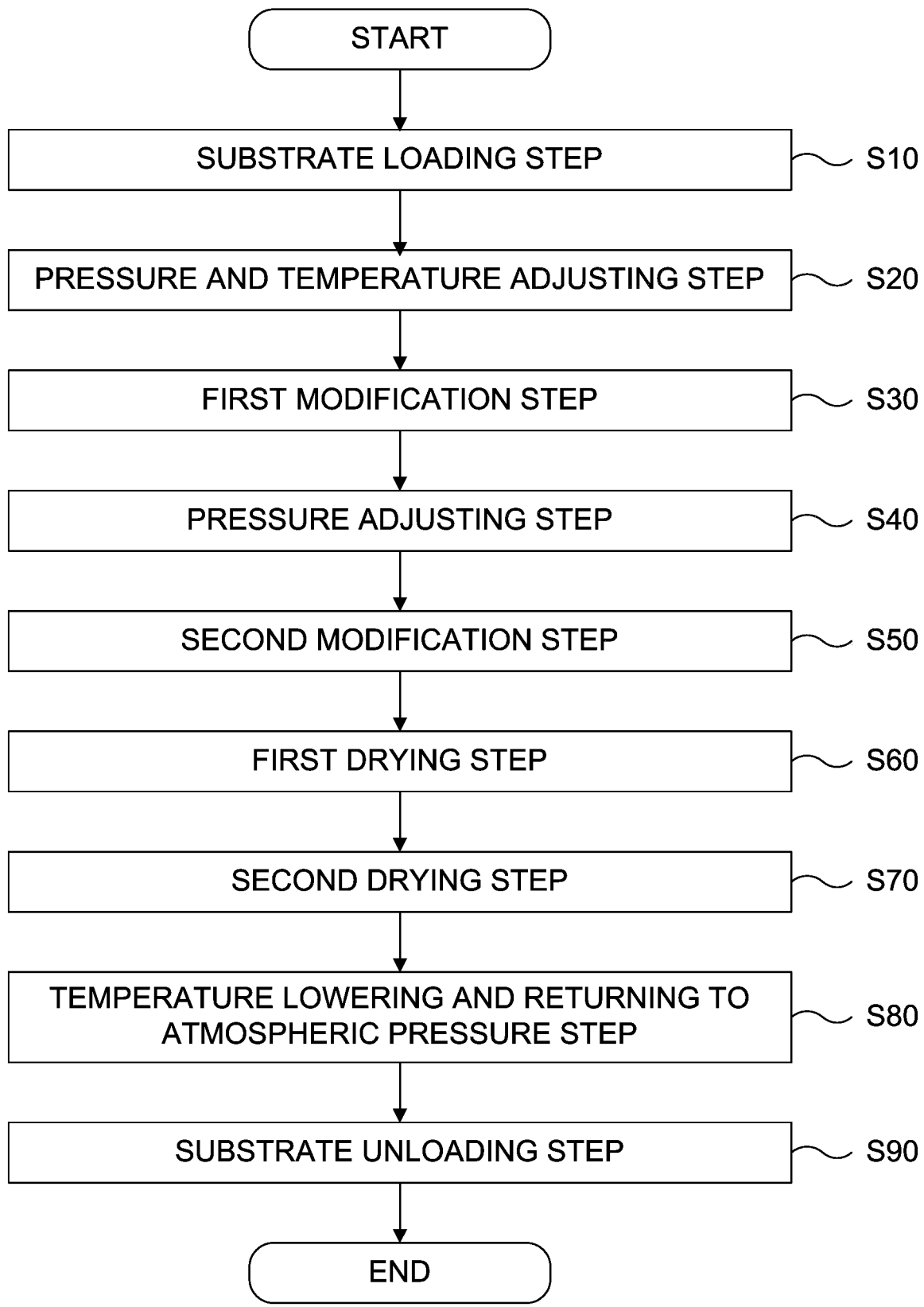

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2018/010051, filed on Mar. 14, 2018, in the WIPO, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Description of the Related Art

As a part of manufacturing processes of a semiconductor device, a substrate processing including a step of vaporizing a liquid source containing hydrogen peroxide ($H_2O_2$) to generate a vaporized gas serving as a process gas and a step of supplying the vaporized gas to a substrate in a process chamber may be performed.

When a gas containing a compound (such as $H_2O_2$) of a high reactivity with a metal is used as the process gas and the process gas is exhausted through an exhaust piping made of the metal, the metal may react with the compound to corrode the exhaust piping, or a component of the metal reacted with the compound may adhere to the substrate in the process chamber to cause metal contamination. On the other hand, an exhaust piping made of a material such as a resin of a low reactivity with the compound may be used. However, it may not be possible to ensure a sufficient pressure resistance or a sufficient gas permeation resistance of the exhaust piping made of the material when increasing a degree of vacuum while the process gas is exhausted through the exhaust piping made of the material (when decreasing an inner pressure of the exhaust piping made of the material).

SUMMARY

Described herein is a technique capable of exhausting a process gas in a wide pressure range even when a gas containing a compound of a high reactivity with a metal is used as the process gas.

According to one aspect of the technique of the present disclosure, there is provided a substrate processing apparatus including: a process chamber in which a substrate is accommodated; a gas supply system configured to supply a process gas containing a compound capable of reacting with a metal into the process chamber; and a gas exhaust system configured to exhaust an inner atmosphere of the process chamber, wherein the gas exhaust system includes: a common exhaust piping in communication with the process chamber; a first exhaust piping made of a resin incapable of reacting with the compound and whose one end is connected to the common exhaust piping via a first valve and the other end is connected to a first exhauster; and a second exhaust piping made of the metal and whose one end is connected to the common exhaust piping via a second valve and the other end is connected to a second exhauster.

BRIEF DESCRIPTION OF THE DRAWINGS

FIG. 4 is a flow chart schematically illustrating an example of a substrate processing performed after the pre-processing step.

DETAILED DESCRIPTION

Embodiment of Present Disclosure

Hereinafter, an embodiment of the present disclosure will be described with reference to FIGS. 1 through 4.

(1) Configuration of Substrate Processing Apparatus

Figure 1:
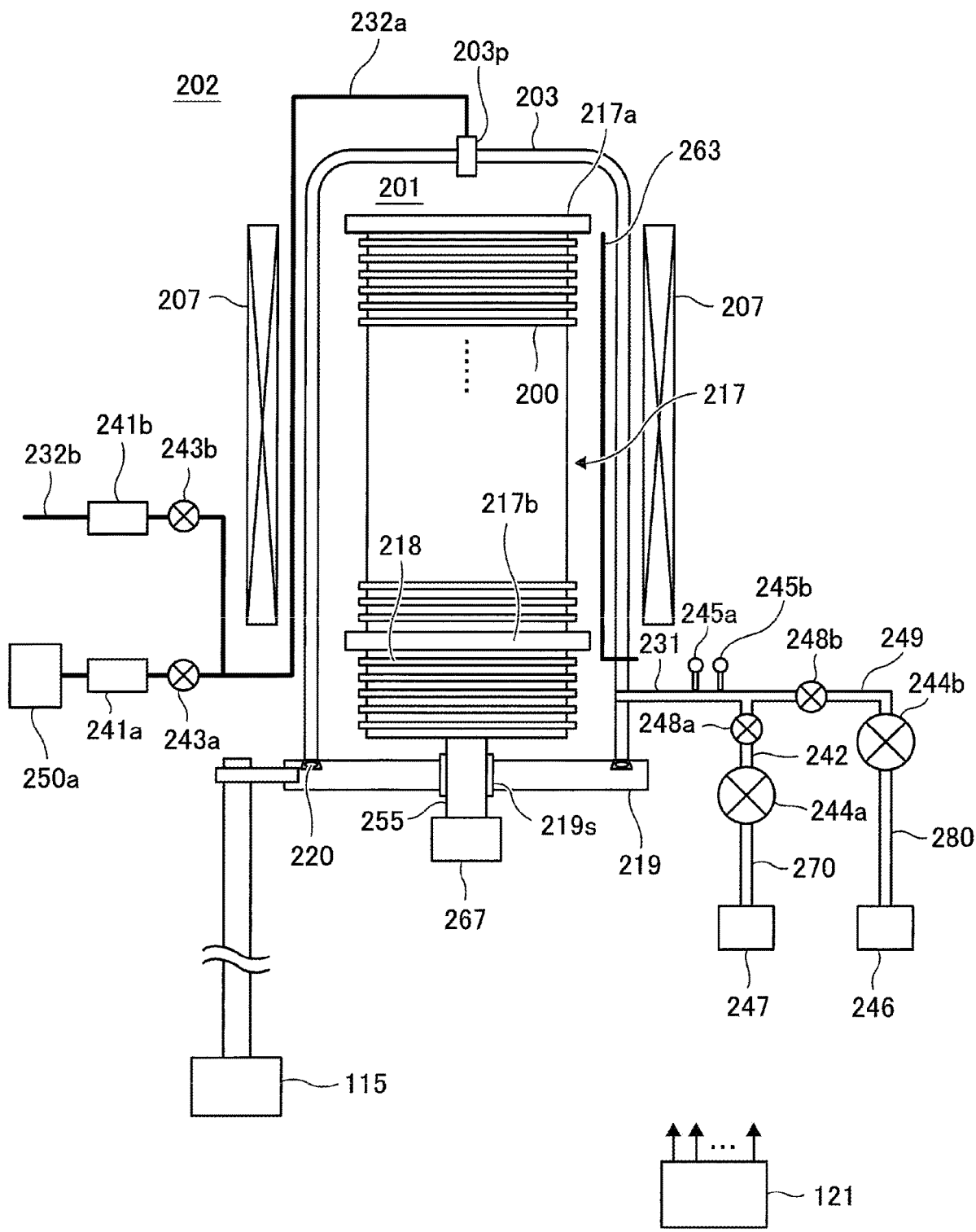
FIG. 1 schematically illustrates a vertical cross-section of a vertical type process furnace of a substrate processing apparatus preferably used in an embodiment described herein.

As shown in FIG. 1, a process furnace 202 of a substrate processing apparatus includes a reaction tube 203. For example, the reaction tube 203 is made of a heat resistant material such as quartz ($SiO_2$), and is configured as a cylinder provided with a gas supply port 203*p* at an upper end thereof and a furnace opening (also referred to as an "opening") at a lower end thereof. A process chamber 201 is provided in a hollow cylindrical portion of the reaction tube 203. The process chamber 201 is configured to accommodate a plurality of wafers including a wafer 200 serving as a substrate.

A seal cap 219 serving as a lid capable of airtightly closing the lower end opening of the reaction tube 203 is provided under the reaction tube 203. For example, the seal cap 219 is made of a non-metallic material such as quartz, and of a disk shape. An O-ring 220 serving as a seal is provided on an upper surface of the seal cap 219 so as to be in contact with the lower end of the reaction tube 203. A rotator (which is a rotating mechanism) 267 is installed below the seal cap 219. A rotating shaft 255 of the rotator 267 is connected to a boat 217 through the seal cap 219. The rotator 267 is configured to rotate the wafer 200 accommodated in the boat 217 by rotating the boat 217. A bearer (which is a bearing portion) 219*s* of the rotating shaft 255 provided on the rotating shaft 255 is configured as a fluid seal such as a magnetic seal. The seal cap 219 is configured to be elevated or lowered in the vertical direction by a boat elevator 115 serving as an elevator (which is an elevating mechanism) installed outside the reaction tube 203. The boat elevator 115 is configured as a transfer device (which is a transfer mechanism) that loads (transfers) the wafer 200 into the process chamber 201 or unloads (transfers) the wafer 200 out of the process chamber 201 by elevating or lowering the seal cap 219.

The boat 217 serving as a substrate retainer aligns the plurality of the wafers including the wafer 200, for example, from 25 to 200 wafers in the vertical direction and supports the plurality of the wafers in a multi-stage manner, while the plurality of the wafers are horizontally oriented with their centers aligned with each other. That is, the boat 217 supports the plurality of the wafers with predetermined intervals therebetween. For example, the boat 217 is made of a heat resistant material such as quartz. The boat 217 includes a top plate 217a and a bottom plate 217b at a top and a bottom thereof. A plurality of heat insulators including a heat insulator 218 are supported in a multi-stage manner under the boat 217. For example, the heat insulator 218 is made of a heat resistant material such as quartz. The heat insulator 218 is configured to suppress the heat conduction between a wafer accommodation region and a region in the vicinity of the furnace opening. The heat insulator 218 may be considered as a part of components of the boat 217.

A heater 207 serving as a heating apparatus is provided outside the reaction tube 203. The heater 207 is vertically installed so as to surround the wafer accommodation region in the process chamber 201. The heater 207 heats the wafer 200 accommodated in the wafer accommodation region to a predetermined temperature. In addition, the heater 207 may function as a liquefaction suppressor (which is a liquefaction suppressing mechanism) that applies thermal energy to a gas supplied into the process chamber 201 to suppress its liquefaction, or may function as an exciter (which is an excitation mechanism) that activates the gas by heat. A temperature sensor 263 serving as a temperature detector is provided in the process chamber 201 along an inner wall of the reaction tube 203. Based on temperature information detected by the temperature sensor 263, an output of the heater 207 may be adjusted.

A gas supply pipe 232a is connected to the gas supply port 203p provided at the upper end of the reaction tube 203. A gas generator 250a, a mass flow controller (WC) 241a serving as a flow rate controller (also referred to as a "flow rate control mechanism") and a valve 243a serving as an opening/closing valve are sequentially installed in order at the gas supply pipe 232a from an upstream side to a downstream side of the gas supply pipe 232a.

The gas generator 250a serving as a vaporizer is configured to generate a process gas by heating hydrogen peroxide solution serving as a liquid source to a predetermined temperature (vaporization temperature), for example, within a range from 120° C. to 200° C. under approximately atmospheric pressure to vaporize the hydrogen peroxide solution or to convert the hydrogen peroxide solution into a mist state. According to the present embodiment, the hydrogen peroxide solution refers to an aqueous solution obtained by dissolving hydrogen peroxide ($H_2O_2$) which is a liquid at normal temperature in water ($H_2O$) serving as a solvent. The gas obtained by vaporizing the hydrogen peroxide solution contains each of the $H_2O_2$ and the $H_2O$ at predetermined concentrations. Hereinafter, the gas is also referred to as a $H_2O_2$-containing gas. The $H_2O_2$ contained in the process gas is a kind of active oxygen, is unstable and easily releases oxygen (O), and generates hydroxyl radical (OH radical) of a very strong oxidizing power.

Therefore, the $H_2O_2$-containing gas serves as a strong oxidizing agent in a substrate processing described later. In the present specification, a notation of a numerical range such as "from 120° C. to 200° C." means that a lower limit and an upper limit are included in the numerical range. Therefore, for example, a numerical range "from 120° C. to 200° C." means a range equal to or higher than 120° C. and equal to or lower than 200° C. The same also applies to other numerical ranges described herein.

A gas supply pipe 232b configured to supply a carrier gas (dilution gas) is connected to the gas supply pipe 232a between a downstream side of the valve 243a and an upstream side of a portion of the gas supply pipe 232a heated by the heater 207. An WC 241b and a valve 243b are sequentially installed in order at the gas supply pipe 232b from an upstream side to a downstream side of the gas supply pipe 232b.

An oxygen (O)-containing gas free of $H_2O_2$ such as oxygen ($O_2$) gas, an inert gas such as a rare gas and nitrogen ($N_2$) gas and a mixed gas thereof may be used as the carrier gas.

According to the present embodiment, when the hydrogen peroxide solution is vaporized or converted into the mist state, the hydrogen peroxide solution is atomized by supplying a vaporization carrier gas together with the hydrogen peroxide solution to the gas generator 250a. A flow rate of the vaporization carrier gas is, for example, about 100 times to 500 times of a flow rate of the hydrogen peroxide solution. The same as the carrier gas (dilution gas) described above may be used as the vaporization carrier gas. When the vaporization carrier gas or the carrier gas (dilution gas) is used, the process gas and the $H_2O_2$-containing gas may further include the vaporization carrier gas and the carrier gas (dilution gas), respectively.

A process gas supplier (also referred to as a "process gas supply system") is constituted mainly by the gas supply pipe 232a, the MFC 241a and the valve 243a. A carrier gas (dilution gas) supplier (also referred to as a "carrier gas (dilution gas) supply system") is constituted mainly by the gas supply pipe 232b, the MFC 241b and the valve 243b.

An exhaust pipe 231 in communication with the process chamber 201 and serving as a common exhaust piping configured to exhaust an inner atmosphere of the process chamber 201 is connected to a lower portion of a side wall of the reaction tube 203. The exhaust pipe 231 is configured as a metal piping, and an inner surface of the metal piping is surface-treated so that the inner surface of the metal piping does not react with the compound (such as the $H_2O_2$ contained in the process gas) of the high reactivity with the metal. A surface treatment such as a coating treatment with a corrosion-resistant nickel (Ni)-based material, a coating treatment with a fluororesin, a surface treatment with ozone and an oxidation treatment by baking (particularly a baking treatment in an air atmosphere) may be performed as a surface treatment performed to the inner surface of the metal piping. A pressure sensor 245a such as a pressure detector serving as a first pressure sensor and a pressure sensor 245b such as a pressure detector serving as a second pressure sensor are provided at the exhaust pipe 231.

The pressure sensor 245a is configured to measure an inner pressure of the exhaust pipe 231 within a predetermined first pressure range, for example, an absolute pressure in a slight decompression range from 600 Torr (79,993 Pa) to the atmospheric pressure, and to output pressure data to a controller 121 connected to the pressure sensor 245a. The pressure sensor 245b is configured to measure the inner pressure of the exhaust pipe 231 within the first pressure range and a second pressure range lower than the first pressure range, for example, an absolute pressure from 0 Torr to the atmospheric pressure, and to output pressure data to the controller 121 connected to the pressure sensor 245b. Zero (0) Torr, which is a lower limit, is a value including a measurement error of the pressure sensor 245b. That is, a pressure range measured by the pressure sensor 245a is narrower than a pressure range measured by the pressure sensor 245b. On the other hand, the pressure sensor 245a measures the inner pressure of the exhaust pipe 231 within the first pressure range with higher accuracy and resolution as compared with the pressure sensor 245b.

The exhaust pipe 231 is branched into two, and one end of an exhaust pipe 249 is connected to one downstream end of the branched exhaust pipe 231 via a valve 248b serving as a second valve. In addition, one end of an exhaust pipe 242 is connected to the other downstream end of the branched exhaust pipe 231 via a valve 248a serving as a first valve.

An exhaust pipe 270 is connected to a downstream end of the exhaust pipe 242 via an APC valve 244a serving as a first pressure adjusting valve. A slight decompression pump 247 serving as a slight decompression exhauster (also referred to as a "first exhauster") is provided at a downstream end of the exhaust pipe 270. The exhaust pipe 242 and the exhaust pipe 270 are made of a material such as a resin that does not react with the compound contained in the process gas and of a high reactivity with a metal. For example, a fluororesin is used as the resin. According to the present embodiment, the exhaust pipe 242 and the exhaust pipe 270 provided at downstream of the valve 248a constitute a first exhaust piping.

The slight decompression pump 247 is configured to exhaust an inside of the exhaust pipe 270 so that an inner pressure of the process chamber 201 reaches a predetermined pressure (for example, 730 Torr) within the first pressure range. Therefore, the slight decompression pump 247 is configured to exhaust the inside of the exhaust pipe 270 to at least a pressure equal to or lower than the predetermined pressure. For example, the slight decompression pump 247 is driven such that an inner pressure of the exhaust pipe 270 is decompressed to 600 Torr. For example, a pump such as a gas ejector and a diaphragm valve type small pump may be used as the slight decompression pump 247, and the gas may be exhausted by creating a differential pressure between a primary side and a secondary side of the slight decompression pump 247. When the gas ejector is used as the slight decompression pump 247, the APC valve 244a and the slight decompression pump 247 may be integrally configured. A portion of the slight decompression pump 247 in contact with the process gas may be made of a material such as a fluororesin that does not react with the compound contained in the process gas and of a high reactivity with a metal.

The valve 248a is configured to switch the presence or absence (ON/OFF) of the exhaust operation through the exhaust pipe 242 by the controller 121 controlling an opening/closing operation of the valve 248a. In addition, with the slight decompression pump 247 in operation, by controlling an opening degree of the APC valve 244a based on pressure information measured by the pressure sensor 245a, the APC valve 244a connected to the controller 121 is configured to vacuum-exhaust the exhaust pipe 242, the exhaust pipe 231 and the process chamber 201 at a slightly decompressed pressure or the atmospheric pressure. By controlling the opening degree of the APC valve 244a to be completely closed, the exhaust through, e.g., the exhaust pipe 242 may be stopped.

The exhaust pipe 249 is configured as a metal piping, and similar to the exhaust pipe 231, an inner surface of the metal piping is surface-treated so that the inner surface of the metal piping does not react with the compound contained in the process gas and of a high reactivity with a metal. An exhaust pipe 280 configured as a metal piping is connected to a downstream end of the exhaust pipe 249 via an APC valve 244b serving as a second pressure adjusting valve. A vacuum pump 246 serving as a vacuum exhauster (also referred to as a "second exhauster") is provided at a downstream end of the exhaust pipe 280. According to the present embodiment, the exhaust pipe 249 and the exhaust pipe 280 provided at downstream of the valve 248b constitute a second exhaust piping. In addition, particularly, the exhaust pipe 280 provided at downstream of the APC valve 244b constitutes a third exhaust piping.

The vacuum pump 246 is configured to exhaust an inside of the exhaust pipe 280 so that the inner pressure of the process chamber 201 reaches a predetermined pressure (for example, 400 Torr) within the second pressure range lower than the first pressure range. Therefore, the vacuum pump 246 is configured to exhaust the inside of the exhaust pipe 280 to at least a pressure equal to or lower than the predetermined pressure. Preferably, the vacuum pump 246 is configured to set (adjust) an inner pressure of the exhaust pipe 280 (an attainable pressure or an exhaust capacity of the vacuum pump 246) to less than 10 Torr. For example, a pump such as a dry pump and a mechanical booster pump may be used as the vacuum pump 246.

The valve 248b is configured to switch the presence or absence (ON/OFF) of the exhaust operation through the exhaust pipe 249 by the controller 121 controlling an opening/closing operation of the valve 248b. In addition, with the vacuum pump 246 in operation, by controlling an opening degree of the APC valve 244b based on pressure information measured by the pressure sensor 245b, the APC valve 244b connected to the controller 121 is configured to vacuum-exhaust the exhaust pipe 249, the exhaust pipe 231 and the process chamber 201. By controlling the opening degree of the APC valve 244b to be completely closed, the exhaust through, e.g., the exhaust pipe 249 may be stopped.

According to the present embodiment, the entire portions in contact with the process gas such as the exhaust pipe 231, the exhaust pipe 249, the exhaust pipe 280 and the vacuum pump 246 may be surface-treated in the same manner as the exhaust pipe 231 described above. However, the surface treatment of the metal piping is expensive. In addition, it is technically difficult and costs more when the surface treatment is performed to a complicated shape such as the vacuum pump 246.

According to the present embodiment, the exhaust pipe 249 provided between the valve 248b and the APC valve 244b is configured as a metal piping, and an inner surface of the exhaust pipe 249 is surface-treated so that the inner surface of the exhaust pipe 249 does not react with the process gas. On the other hand, the exhaust pipe 280, which is provided at a downstream side of the APC valve 244b and between the APC valve 244b and the vacuum pump 246, is configured as a metal piping, and the surface treatment describe above is not performed on an inner surface of the exhaust pipe 280.

The reason why the exhaust pipe 249 and the exhaust pipe 280 can be configured as described above is as follows. When an inner pressure of the exhaust pipe 249 is adjusted by the APC valve 244b with the vacuum pump 246 in operation, the inner pressure of the exhaust pipe 280 on the downstream side of the APC valve 244b has dropped to the attainable pressure (or the exhaust capacity) of the vacuum pump 246, and a concentration of the process gas flowing in the exhaust pipe 280 becomes extremely low. That is, while the vacuum pump 246 is in operation, the concentration of the process gas in the exhaust pipe 280 is extremely low, and there is a low possibility that the metal contained the exhaust pipe 280 will react with the compound contained in the process gas.

In addition, instead of providing the valve 248b independently, a valve integrally including an opening/closing function of the valve 248b and a pressure adjusting function of the APC valve 244*b* may be provided. When the valve described above is provided, the exhaust pipe 249 may be omitted, that is, the exhaust piping (that is, the exhaust pipe 249 and the exhaust pipe 280) on the downstream side of the valve 248*b* and on the downstream side of the APC valve 244*b* can be replaced with the exhaust pipe 280 configured as the metal piping not subjected to the surface treatment described above.

A slight decompression exhaust system is constituted mainly by the exhaust pipe 231, the pressure sensor 245*a*, the valve 248*a*, the exhaust pipe 242, the APC valve 244*a*, the exhaust pipe 270 and the slight decompression pump 247. A vacuum exhaust system is constituted mainly by the exhaust pipe 231, the pressure sensor 245*b*, the valve 248*b*, the exhaust pipe 249, the APC valve 244*b*, the exhaust pipe 280 and the vacuum pump 246. In addition, a gas exhaust system configured to exhaust the inner atmosphere of the process chamber 201 is constituted by the slight decompression exhaust system and the vacuum exhaust system.

Figure 2:
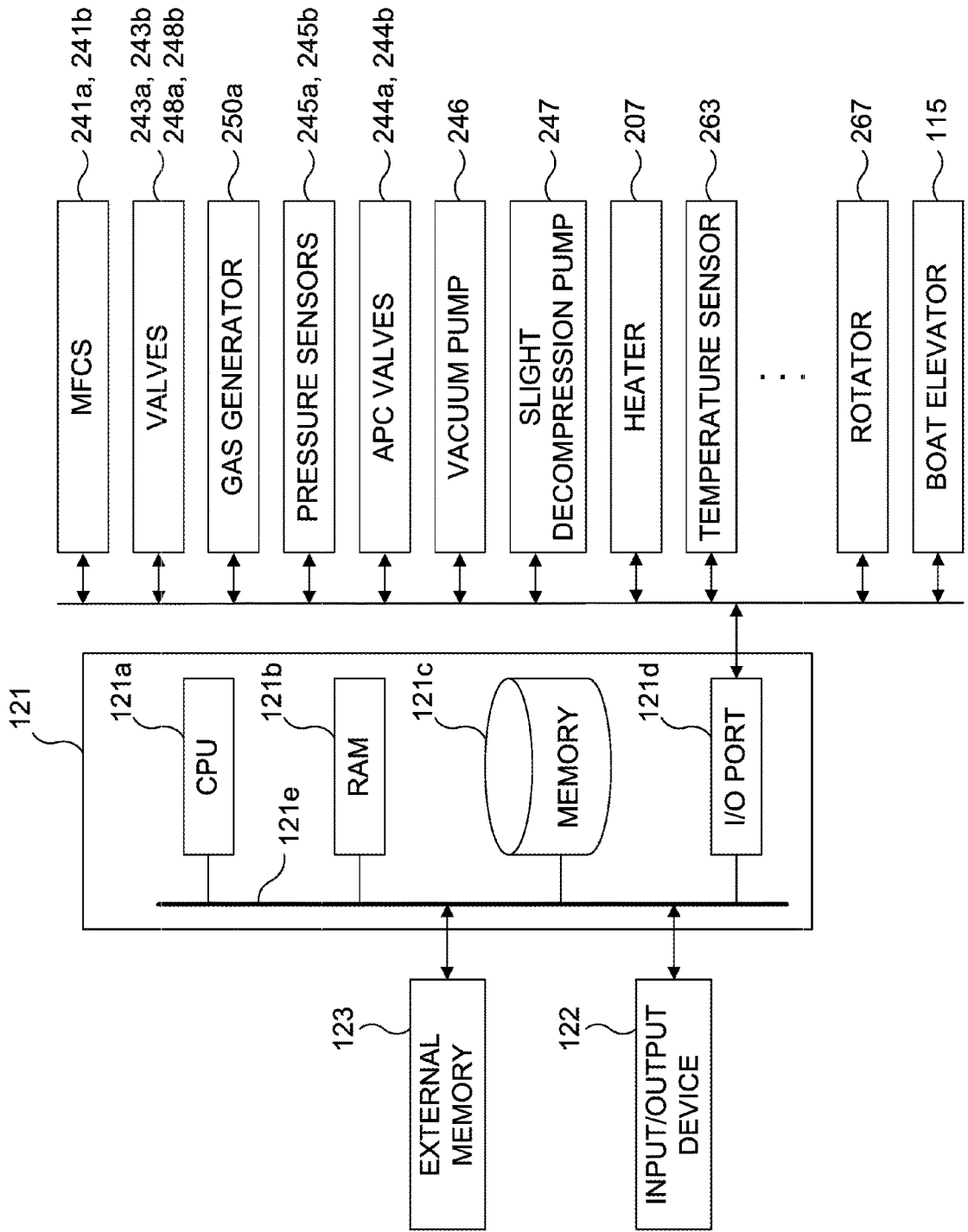
FIG. 2 is a block diagram schematically illustrating a configuration of a controller and related components of the substrate processing apparatus preferably used in the embodiment described herein.

As shown in FIG. 2, the controller 121 serving as a control device is constituted by a computer including a CPU (Central Processing Unit) 121*a*, a RAM (Random Access Memory) 121*b*, a memory (also referred to as a "memory device") 121*c* and an I/O port 121*d*. The RAM 121*b*, the memory 121*c* and the I/O port 121*d* may exchange data with the CPU 121*a* through an internal bus 121*e*. For example, an input/output device 122 such as a touch panel is connected to the controller 121.

The memory 121*c* is configured by components such as a flash memory and a hard disk drive (HDD). For example, a control program for controlling the operation of the substrate processing apparatus and a process recipe containing information on the sequences and the conditions of the substrate processing described later are readably stored in the memory 121*c*. The process recipe is obtained by combining steps of the substrate processing described later such that the controller 121 can execute the steps to acquire a predetermine result, and functions as a program. Hereafter, the process recipe and the control program may be collectively or individually referred to as a "program". The process recipe may also be simply referred to as a "recipe". In the present specification, the term "program" may indicate only the recipe, may indicate only the control program, or may indicate both of the recipe and the control program. The RAM 121*b* functions as a memory area where a program or data read by the CPU 121*a* is temporarily stored.

The I/O port 121*d* is connected to the above-described components such as the MFCs 241*a* and 241*b*, the valves 243*a*, 243*b*, 248*a* and 248*b*, the gas generator 250*a*, the pressure sensors 245*a* and 245*b*, the APC valves 244*a* and 244*b*, the vacuum pump 246, the slight decompression pump 247, the heater 207, the temperature sensor 263, the rotator 267 and the boat elevator 115.

The CPU 121*a* is configured to read the control program from the memory 121*c* and execute the read control program. Furthermore, the CPU 121*a* is configured to read the recipe from the memory 121*c* according to an operation command inputted from the input/output device 122. According to the contents of the read recipe, the CPU 121*a* may be configured to control various operations such as a gas generating operation by the gas generator 250*a*, gas flow rate adjusting operations by the MFCs 241*a* and 241*b*, opening/closing operations of the valves 243*a*, 243*b*, 248*a* and 248*b*, opening/closing operations of the APC valves 244*a* and 244*b*, a pressure adjusting operation by the APC valve 244*a* based on the pressure sensor 245*a*, a pressure adjusting operation by the APC valve 244*b* based on the pressure sensor 245*b*, a start and stop of the slight decompression pump 247, a start and stop of the vacuum pump 246, a temperature adjusting operation by the heater 207 based on the temperature sensor 263, a rotation operation and a rotation speed adjusting operation of the boat 217 by the rotator 267 and an elevating and lowering operation of the boat 217 by the boat elevator 115.

The controller 121 may be embodied by installing the above-described program stored in an external memory (also referred to as an "external memory device") 123 into a computer. For example, the external memory 123 may include a magnetic disk such as a hard disk drive (HDD), an optical disk such as a CD, a magneto-optical disk such as an MO and a semiconductor memory such as a USB memory. The memory 121*c* or the external memory 123 may be embodied by a non-transitory computer readable recording medium. Hereafter, the memory 121*c* and the external memory 123 may be collectively or individually referred to as the recording medium. In the present specification, the term "recording medium" may indicate only the memory 121*c*, may indicate only the external memory 123, and may indicate both of the memory 121*c* and the external memory 123. Instead of the external memory 123, a communication means such as the Internet and a dedicated line may be used for providing the program to the computer.

(2) Pre-Processing

Subsequently, a pre-processing step performed before the substrate processing is performed to the wafer 200 will be described with reference to FIG. 3.

Figure 3:
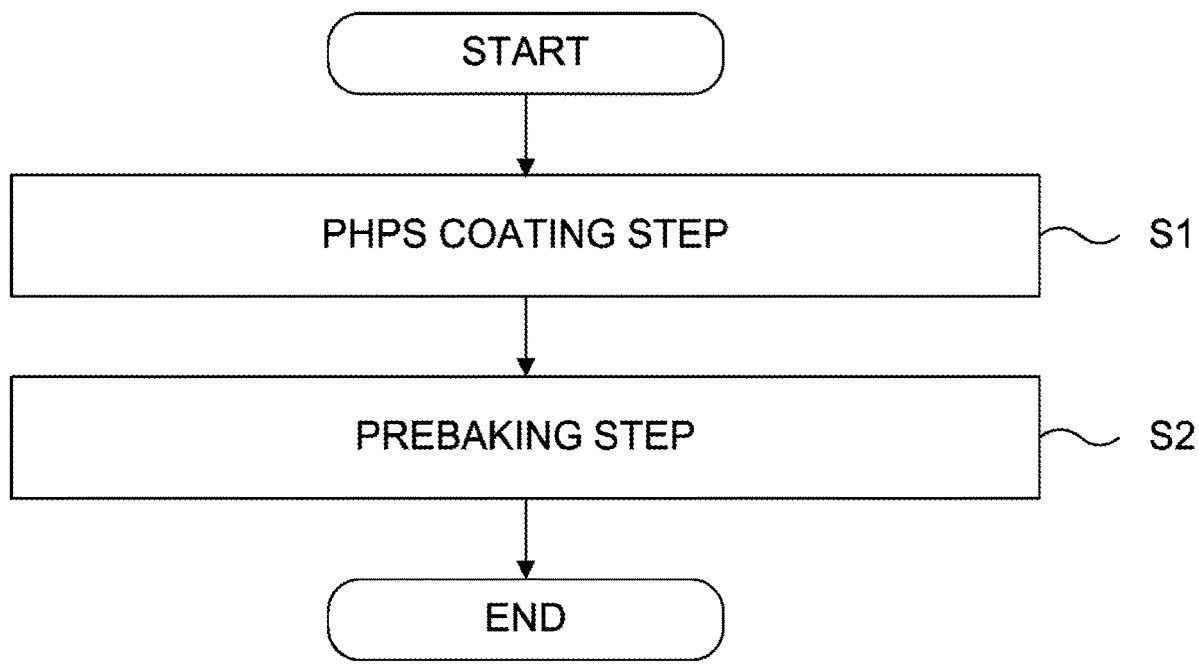
FIG. 3 is a flow chart schematically illustrating an example of a pre-processing step.

As shown in FIG. 3, according to the pre-processing step, a polysilazane (PHPS) coating step S1 and a prebaking step S2 are sequentially performed to the wafer 200. In the PHPS coating step S1, a coating liquid (polysilazane solution) containing polysilazane is coated onto a surface of the wafer 200 by a method such as a spin coating method. In the prebaking step S2, the solvent is removed from the coated film by heating the wafer 200 with the coated film formed thereon. By heating the wafer 200 with the coated film formed thereon at a process temperature (prebaking temperature) ranging from 70° C. to 250° C., for example, it is possible to volatilize the solvent from the coated film. It is preferable that the wafer 200 is heated to about 150° C.

The coated film formed on the surface of the wafer 200 becomes a film containing a silazane bond (—Si—N—), that is, a polysilazane film by performing the prebaking step S2. The polysilazane film contains nitrogen (N) and hydrogen (H) in addition to silicon (Si). The polysilazane film may further contain carbon (C) and other impurities in some cases. According to the substrate processing described later, by supplying a vaporized gas such as the $H_2O_2$-containing gas to the polysilazane film formed on the wafer 200 under a relatively low temperature condition, the polysilazane film is modified (oxidized) into a silicon oxide film.

(3) Substrate Processing

Subsequently, an example of the substrate processing performed as a part of manufacturing processes of a semiconductor device using the substrate processing apparatus described above will be described with reference to FIG. 4. Hereinafter, the operations of the components constituting the substrate processing apparatus are controlled by the controller 121.

<Substrate Loading Step S10>

The plurality of the wafers including the wafer 200 with the polysilazane film formed on the surface thereof are loaded (charged) into the boat 217. After the boat 217 is charged with the plurality of the wafers, the boat 217 accommodating the plurality of the wafers is elevated by the boat elevator 115 and loaded into the process chamber 201 as shown in FIG. 1. With the boat 217 loaded, the seal cap 219 seals the lower end opening of the reaction tube 203.

<Pressure and Temperature Adjusting Step S20>

An inside of the process chamber 201 in which the plurality of the wafers including the wafer 200 are accommodated is exhausted to the slightly decompressed pressure or the atmospheric pressure by the APC valve 244a and the slight decompression pump 247 so that the inner pressure of the process chamber 201 reaches a predetermined pressure (first process pressure). While exhausting the inside of the process chamber 201, the slight decompression pump 247 is driven with the valve 248a open and the valve 248b closed, the inner pressure of the process chamber 201 is measured by the pressure sensor 245a, and the APC valve 244a is feedback-controlled based on the measured pressure information. That is, a process using the slight decompression exhaust system is performed.

The heater 207 heats the process chamber 201 such that a temperature of the wafer 200 in the process chamber 201 reaches a predetermined temperature. The state of electrical conduction to the heater 207 is feedback-controlled based on the temperature information detected by the temperature sensor 263 such that the temperature of the wafer 200 reaches the predetermined temperature. The heater 207 is continuously feedback-controlled at least until the processing on the wafer 200 is completed. The rotator 267 starts to rotate the wafer 200. Until at least the processing of the wafer 200 is completed, the heater 207 continuously heats the wafer 200 and the rotator 267 continuously rotates the wafer 200.

First Modification Step S30

Subsequently, the valve 243a is opened to supply the $H_2O_2$-containing gas (that is, the process gas) into the process chamber 201 through the MFC 241a, the first gas supply pipe 232a and the gas supply port 203p. The process gas supplied into the process chamber 201 flows downward in the process chamber 201, and is discharged out of the process chamber 201 through the exhaust pipe 231. That is, a first process using the slight decompression exhaust system is performed by driving the slight decompression pump 247 with the valve 248a open and the valve 248b closed while supplying the process gas into the process chamber 201. While performing the first process, the APC valve 244a is controlled so that the pressure measured by the pressure sensor 245a reaches the predetermined first process pressure (for example, 730 Torr) within the first pressure range (for example, a range from 600 Torr to the atmospheric pressure). Thereby, the process gas is supplied onto the wafer 200. As a result, an oxidation reaction occurs on the surface of the wafer 200, and the polysilazane film on the wafer 200 is modified into the silicon oxide film (also simply referred to as an "SiO film").

When the process gas is supplied into the process chamber 201, the valve 243b may be opened to supply the $O_2$ gas (that is, the carrier gas) into the process chamber 201 through the gas supply pipe 232a and the gas supply port 203p while a flow rate of the $O_2$ gas is adjusted by the MFC 241b. When the $O_2$ gas is supplied, the vaporized gas is diluted with the $O_2$ gas in the gas supply pipe 232a and supplied into the process chamber 201 in a diluted state. In the present specification, the process gas diluted with the $O_2$ gas may also be simply referred to as the process gas for convenience.

After a predetermined time has elapsed from the start of the supply the process gas onto the wafer 200, the valve 243a is closed to stop the supply of the process gas into the process chamber 201. When the $O_2$ gas is supplied through the gas supply pipe 232b in the first modification step S30, the valve 243b may be closed to stop the supply of the $O_2$ gas into the process chamber 201 simultaneously as the supply of the process gas is stopped or after a predetermined time has elapsed. Alternatively, the valve 243b may be maintained open to continuously supply the $O_2$ gas into the process chamber 201 until a second modification step S50 is started or completed, or until a first drying step S60 or a second drying step S70 is started or completed. In addition, the second modification step S50 may be started by switching an exhaust system from the slight decompression exhaust system to the vacuum exhaust system by closing the valve 248a and opening the valve 248b without stopping the supply of the process gas and the supply of the $O_2$ gas into the process chamber 201.

For example, process conditions of the first modification step S30 are as follows:

Concentration of the $H_2O_2$ of the liquid source: from 20% to 40%, preferably from 25% to 35%;

Modification pressure (that is, the first process pressure): 600 Torr or more, preferably from 700 Torr to the atmospheric pressure (the atmospheric pressure or the slightly decompressed pressure);

Temperature of the wafer 200: from 70° C. to 110° C., preferably from 70° C. to 80° C.; Supply flow rate of the liquid source: from 1.0 sccm to 10 sccm, preferably from 1.6 sccm to 8 sccm;

Concentration of the $H_2O_2$ of the vaporized gas: from 1 mol % to 12 mol %;

Flow rate of the $O_2$ gas (that is, the carrier gas): from 0 SLM to 20 SLM, preferably from 5 SLM to 10 SLM; and Supply time (time duration) of the gas: from 10 minutes to 720 minutes.

According to the present embodiment, by performing the first modification step S30 under a pressure condition of the atmospheric pressure or the slightly decompressed pressure, it is possible to perform a modification process to the wafer 200 by using the process gas with a higher $H_2O_2$ concentration as compared with a case when the modification process is performed under a low pressure condition of less than 600 Torr.

However, on the other hand, when the process gas with such a high $H_2O_2$ concentration is exhausted through the metal piping, the compound such as the $H_2O_2$ of the high reactivity with the metal piping may react with the metal contained in the metal piping to corrode the metal piping or to cause metal contamination. In addition, when the first modification step S30 is performed under the pressure condition of the atmospheric pressure or the slightly decompressed pressure and a low temperature condition of 70° C. to 110° C. according to the present embodiment, a condensation of the process gas is extremely likely to occur in the gas exhaust system. A liquid generated by the condensation may contain a high concentration of the compound of the high reactivity with the metal piping, and the liquid may react with the metal in the metal piping to corrode the metal piping or to cause the metal contamination.

According to a configuration of the slight decompression exhaust system according to the present embodiment, even when the gas or the liquid containing the high concentration of the compound of the high reactivity with the metal comes into contact with the exhaust pipe 231, the exhaust pipe 242 and the slight decompression pump 247 constituting the slight decompression exhaust system, it is possible to prevent the slight decompression exhaust system from being corroded or from occurring the metal contamination.

In addition, as described above, when the first modification step S30 is performed under the high pressure condition describe above and the low temperature condition described above, the condensation of the process gas is extremely likely to occur in the process chamber 201 or in the gas exhaust system. With respect to the problem described above, according to the configuration of the slight decompression exhaust system according to the present embodiment, the inner pressure of the exhaust pipe 231 is obtained by using the pressure sensor 245a capable of measuring the inner pressure of the exhaust pipe 231 with a particularly high accuracy and a particularly high resolution in a limited pressure range (that is, the first pressure range) at the atmospheric pressure or the slightly decompressed pressure, and the APC valve 244a configured to control the pressure such as the inner pressure of the process chamber 201 is controlled based on the obtained pressure data. Therefore, even when the $H_2O_2$ concentration of the process gas is maintained at a high value and the wafer 200 is processed at a low temperature of 70° C. to 110° C., by minimizing a pressure fluctuation in the process chamber 201 or in the exhaust pipe 231, it is possible to suppress the occurrence of the condensation due to the pressure fluctuation.

In addition, by providing the slight decompression pump 247 in the slight decompression exhaust system, it is possible to accurately control the inner pressure of the process chamber 201 within the first pressure range. That is, each of the APC valves 244a and 244b realizes a pressure control by changing a clearance (or a pressure loss) in a piping path. However, when the pressure control is performed within the first pressure range using the vacuum exhaust system including the vacuum pump 246, a negative pressure created by the vacuum pump 246 is large and the APC valve 244b has to perform the pressure control at an extremely narrow gap. Therefore, the pressure may be unstable and it is difficult to control the inner pressure of the process chamber 201. On the other hand, when the pressure control is performed using the slight decompression exhaust system where the exhaust is performed by the slight decompression pump 247, a control width of the clearance in the piping path of the APC valve 244a can be widened, thereby making it possible to easily stabilize the pressure.

<Pressure Adjusting Step S40>

Subsequently, after the first modification step S30 is completed, the valve 248a is closed and then the valve 248b is opened to switch the exhaust system from the slight decompression exhaust system to the vacuum exhaust system. The inside of the process chamber 201 is vacuum-exhausted by the vacuum pump 246 and the inner pressure of the process chamber 201 is adjusted by the APC valve 244b so that the inner pressure of the process chamber 201 reaches a predetermined pressure (second process pressure). While exhausting the inside of the process chamber 201, the vacuum pump 246 is driven with the valve 248b open and the valve 248a closed, the inner pressure of the process chamber 201 is measured by the pressure sensor 245b, and the APC valve 244b is feedback-controlled based on the measured pressure information.

Second Modification Step S50

Subsequently, similar to the first modification step S30, the valve 243a is opened to supply the $H_2O_2$-containing gas (that is, the process gas) into the process chamber 201. That is, the $H_2O_2$-containing gas is again supplied onto the wafer 200. That is, a second process using the vacuum exhaust system is performed by driving the vacuum pump 246 with the valve 248a closed and the valve 248b open while supplying the process gas into the process chamber 201. While performing the second process, the APC valve 244b is controlled so that the pressure measured by the pressure sensor 245b reaches the predetermined second process pressure (for example, 600 Torr or less) within second pressure range (for example, a range from 400 Torr to 500 Torr) and lower than the first process pressure. In the second modification step S50, similar to the first modification step S30, the $O_2$ gas may be supplied into the process chamber 201.

After a predetermined time has elapsed from the start of the supply the process gas onto the wafer 200, the valve 243a is closed to stop the supply of the process gas into the process chamber 201. When the $O_2$ gas is supplied through the gas supply pipe 232b in the second modification step S50, the valve 243b may be closed to stop the supply of the $O_2$ gas into the process chamber 201 simultaneously as the supply of the process gas is stopped or after a predetermined time has elapsed. Alternatively, the valve 243b may be maintained open to continuously supply the $O_2$ gas into the process chamber 201 until the first drying step S60 or the second drying step S70 is started or completed.

For example, process conditions of the second modification step S50 are as follows:

Concentration of the $H_2O_2$ of the liquid source: from 20% to 40%, preferably from 25% to 35%;

Modification pressure (that is, the second process pressure): 600 Torr or less, preferably from 400 Torr to 500 Torr (a decompressed pressure or a vacuum pressure);

Temperature of the wafer 200: from 70° C. to 110° C., preferably from 70° C. to 80° C.;

Supply flow rate of the liquid source: from 1.0 sccm to 10 sccm, preferably from 1.6 sccm to 8 sccm;

Concentration of the $H_2O_2$ of the vaporized gas: from 1 mol % to 12 mol %;

Flow rate of the $O_2$ gas (that is, the carrier gas): from 0 SLM to 20 SLM, preferably from 5 SLM to 10 SLM; and Supply time (time duration) of the gas: from 10 minutes to 720 minutes.

In the second modification step S50, the process gas containing the compound of the high reactivity with the metal is discharged from an inside of the process chamber 201 through the exhaust pipe 231, the exhaust pipe 249, the exhaust pipe 280 and the vacuum pump 246 constituting the vacuum exhaust system. However, the surface treatment is performed on the inner surfaces of the exhaust pipe 231 and the exhaust pipe 249, which are configured as the metal piping, so that the inner surfaces of the exhaust pipe 231 and the exhaust pipe 249 do not react with the compound contained in the process gas and of the high reactivity with the metal contained in the metal piping. In addition, as described above, while the vacuum pump 246 is in operation, the concentration of the process gas in the exhaust pipe 280 is extremely low, and there is a low possibility that the metal contained the exhaust pipe 280 will react with the compound contained in the process gas. Therefore, according to the vacuum exhaust system according to the present embodiment, in the second modification step S50, it is possible to prevent the vacuum exhaust system from being corroded or from undergoing the metal contamination.

In addition, unlike the slight decompression exhaust system, each exhaust piping of the vacuum exhaust system is made of a metal, not a resin with a property that does not react with the compound of the high reactivity with the metal. There may be problems in ensuring a sufficient pressure resistance or a sufficient gas permeation resistance when the exhaust piping made of the resin is exhausted by the vacuum pump 246 in the second modification step S50. According to the present embodiment, by switching between the slight decompression exhaust system including the exhaust piping made of the resin and the vacuum exhaust system including the exhaust piping made of the metal depending on the process pressure, it is possible to exhaust the gas remaining in the process chamber in a short time while preventing the problem such as the corrosion of the gas exhaust system by the process gas and ensuring the sufficient pressure resistance or the sufficient gas permeation resistance.

Further, in the second modification step S50, since the inner pressure of the process chamber 201 is set to the second process pressure lower than the first process pressure, the condensation is less likely to occur in the process chamber 201 and the gas exhaust system as compared with the first modification step S30. Therefore, a possibility that the liquid generated by the condensation and containing a high concentration of the compound of the high reactivity with the metal may enter the vacuum exhaust system is lower as compared with the slight decompression exhaust system.

<First Drying Step S60>

After the second modification step S50 is completed, the heater 207 is controlled so that the wafer 200 is heated to a predetermined temperature (drying temperature) higher than the above-described temperature of the wafer 200 in the second modification step S50 and equal to or less than the above-described prebaking temperature. For example, the drying temperature may be a temperature ranging from 120° C. to 160° C. By heating the wafer 200, an inner temperature of the process chamber 201 is also elevated. By elevating and maintaining the inner temperature of the process chamber 201, it is possible to gently dry the wafer 200 and the inside of the process chamber 201. For example, a process pressure of the first drying step S60 is set equal to the process pressure of the first modification step S30. That is, after the second modification step S50 is completed, the valve 248b is closed and the valve 248a is opened to switch the exhaust system from the vacuum exhaust system to the slight decompression exhaust system. Then, the pressure such as the inner pressure of the process chamber 201 is adjusted by the APC valve 244a while driving the slight decompression pump 247 so that the gas remaining in the process chamber 201 and the exhaust pipe 231 is exhausted using the slight decompression exhaust system. By performing the first drying step S60, in addition to by-products such as ammonia ($NH_3$), ammonium chloride ($NH_4Cl$), carbon (C) and hydrogen (H) desorbed from the polysilazane film, it is also possible to remove impurities such as an outgas due to the solvent and impurities due to the $H_2O_2$ from a surface or an inside of the SiO film. It is also possible to suppress the substances described above from reattaching the wafer 200.

<Second Drying Step S70>

Subsequently, when the wafer 200 is dried by the first drying step S60, the exhaust system is switched from the slight decompression exhaust system to the vacuum exhaust system to dry the inside of the process chamber 201. That is, after the first drying step S60 is completed, the valve 248a is closed and the valve 248b is opened to switch the exhaust system from the slight decompression exhaust system to the vacuum exhaust system. Then, the pressure such as the inner pressure of the process chamber 201 is adjusted by the APC valve 244b while driving the vacuum pump 246 so that the inside of the process chamber 201 and an inside of the exhaust pipe 231 are further exhausted using the vacuum exhaust system. For example, a process pressure of the second drying step S70 is set equal to the process pressure of the first drying step S60. However, in order to promote drying the inside of the process chamber 201, the process pressure of the second drying step S70 may be lower than that of the first drying step S60.

<Temperature Lowering and Returning to Atmospheric Pressure Step S80>

After the second drying step S70 is completed, the exhaust system is switched from the vacuum exhaust system to the slight decompression exhaust system, and the $N_2$ gas is supplied into the process chamber 201. While supplying the $N_2$ gas, the inner pressure of the process chamber 201 is adjusted by the APC valve 244b to, for example, the atmospheric pressure so that the inner pressure of the process chamber 201 is returned to the atmospheric pressure and a heat capacity in the process chamber 201 is increased. As a result, it is possible to uniformly heat the wafer 200 and the components in the process chamber 201, and to remove substances (for example, particles, the impurities and the outgas that cannot be removed by the vacuum exhaust) from the process chamber 201. After a predetermined time has elapsed, the inner temperature of the process chamber 201 is lowered to a predetermined unloadable temperature at which the wafer 200 can be unloaded.

<Substrate Unloading Step S90>

The seal cap 219 is lowered by the boat elevator 115 and the lower end of the reaction tube 203 is opened. Then, the boat 217 accommodating a plurality of processed wafers including the wafer 200 is unloaded out of the reaction tube 203 through the lower end opening of the reaction tube 203. After the boat 217 is unloaded out of the reaction tube 203, the plurality of the processed wafers including the wafer 200 are transferred (discharged) out of the boat 217.

According to the present embodiment, it is possible to accurately perform the pressure control from the vicinity of the atmospheric pressure to the vacuum range by configuring the exhaust system of the process chamber 201 as two system lines, that is, the vacuum exhaust system and the slight decompression exhaust system. In addition, since the pressure control can be performed accurately, it is possible to reduce a possibility that the condensation may occur in the components such as the process chamber 201. Since foreign matters or the metal contamination is prevented from occurring on the wafer, it is possible to increase the semiconductor yield.

Other Embodiments of Present Disclosure

While the embodiment of the technique described above is described by way of an example in which the vaporized gas of the hydrogen peroxide solution is used as the process gas containing the compound of the high reactivity with the metal, the technique is not limited thereto. For example, a process gas containing a compound (other than $H_2O_2$) of a high reactivity with the metal may be used.

While the embodiment of the technique described above is described by way of an example in which the vaporized gas is generated outside the process chamber 201, the technique is not limited thereto. For example, the vaporized gas may be generated inside the process chamber 201. For example, the vaporized gas may be generated by supplying the liquid source to the top plate 217a heated by a heater such as a lamp heater to vaporize the liquid source.

While the embodiment of the technique described above is described by way of an example in which the substrate with the polysilazane film formed thereon is processed, the technique is not limited thereto. For example, even when a non-prebaked silicon-containing film formed by a flowable CVD method is processed, it is possible to obtain the same effects according to the embodiment described above.

The above-described embodiments may be appropriately combined. The processing sequences and the processing conditions of the combinations may be substantially the same as those of the above-described embodiments.

According to some embodiments in the present disclosure, it is possible to exhaust the process gas in a wide pressure range even when the gas containing the compound of a high reactivity with the metal is used as the process gas.

What is claimed is:

1. A substrate processing apparatus comprising:
a process chamber in which a substrate is accommodated;
a gas supply system configured to supply a process gas containing a compound capable of reacting with a metal into the process chamber;
a gas exhaust system configured to exhaust an inner atmosphere of the process chamber; and
a controller configured to be capable of controlling the gas supply system and the gas exhaust system,
wherein the gas exhaust system comprises:
a common exhaust piping in communication with the process chamber;
a first exhaust piping made of a resin incapable of reacting with the compound and whose one end is connected to the common exhaust piping via a first valve and a first pressure adjusting valve and the other end is connected to a first exhauster;
a second exhaust piping made of the metal and whose one end is connected to the common exhaust piping via a second valve and a second pressure adjusting valve and the other end is connected to a second exhauster, wherein a portion of the second exhaust piping downstream of the second pressure adjusting valve is made of a metal piping whose inner surface is not surface-treated by the resin,
a first exhauster connected to the first exhaust piping and configured to exhaust an inside of the first exhaust piping to a pressure level within a first pressure range, and
a second exhauster connected to the second exhaust piping and configured to exhaust an inside of the second exhaust piping to a pressure level within a second pressure range lower than the first pressure range,
wherein the controller is configured to be capable of controlling the gas supply system and the gas exhaust system to perform:
exhausting the inner atmosphere of the process chamber comprising the process gas by opening the first valve while supplying the process gas into the process chamber; and
exhausting the inner atmosphere of the process chamber comprising the process gas by opening the second valve.

2. The substrate processing apparatus of claim 1, wherein the common exhaust piping comprises a metal piping whose inner surface is surface-treated so as not to react with the compound.

3. The substrate processing apparatus of claim 1, wherein the first exhauster is made of a resin incapable of reacting with the compound.

4. The substrate processing apparatus of claim 1, further comprising:
a first pressure sensor configured to measure an inner pressure of the common exhaust piping within the first pressure range;
a second pressure sensor configured to measure the inner pressure of the common exhaust piping within the first pressure range and the second pressure range;
a first pressure adjusting valve whose opening degree is controlled based on a pressure measured by the first pressure sensor; and
a second pressure adjusting valve whose opening degree is controlled based on a pressure measured by the second pressure sensor.

5. The substrate processing apparatus of claim 4, wherein a pressure range measured by the first pressure sensor is narrower than a pressure range measured by the second pressure sensor.

6. The substrate processing apparatus of claim 5, wherein the first pressure sensor is configured to measure the pressure ranging from 600 Torr to an atmospheric pressure at most, the second pressure sensor is configured to measure the pressure ranging from 0 Torr to the atmospheric pressure at most.

7. The substrate processing apparatus of claim 1, wherein the second pressure adjusting valve is piping located more upstream of the second exhauster in the second exhaust piping,
and a portion of the second exhaust piping between the second pressure adjusting valve and the second exhauster is configured as a metal piping.

8. The substrate processing apparatus of claim 7, wherein a portion of the second exhaust piping between the second valve and the second pressure adjusting valve is configured as a metal piping whose inner surface is surface-treated so as not to react with the compound.

9. The substrate processing apparatus of claim 4, wherein the controller is further configured to be capable of controlling the gas supply system, the gas exhaust system to perform:
(a) opening the first valve open while supplying the process gas into the process chamber by controlling the gas supply system and operating the first exhauster with the second valve closed; and
(b) operating the second exhauster with the first valve closed and the second valve open.

10. The substrate processing apparatus of claim 9, wherein the controller is further configured to be capable of controlling the first pressure adjusting valve such that the pressure measured by the first pressure sensor reaches a predetermined first process pressure in (a), and controlling the second pressure adjusting valve such that the pressure measured by the second pressure sensor reaches a predetermined second process pressure lower than the first process pressure in (b).

11. The substrate processing apparatus of claim 10, wherein the first process pressure is a predetermined pressure ranging from 600 Torr to an atmospheric pressure at most.

12. The substrate processing apparatus of claim 1, wherein the process gas comprises a gas containing hydrogen peroxide as the compound.

13. A method of manufacturing a semiconductor device comprising:
(a) placing a substrate in a process chamber;
(b) supplying a process gas containing a compound capable of reacting with a metal into the process chamber and exhausting an inner atmosphere of the process chamber by: a common exhaust piping in communication with the process chamber; a first exhaust piping made of a resin incapable of reacting with the compound and whose one end is connected to the common exhaust piping via a first valve and a first pressure adjusting valve; and a first exhauster connected to the first exhaust piping and configured to exhaust an inside of the first exhaust piping to a pressure level within a first pressure range; and (c) exhausting the inner atmosphere of the process chamber by: the common exhaust piping; a second exhaust piping made of the metal and whose one end is connected to the common exhaust piping via a second valve and a second pressure adjusting valve; and a second exhauster connected to the second exhaust piping, wherein a portion of the second exhaust piping downstream of the second pressure adjusting valve is made of a metal piping whose inner surface is not surface-treated by the resin.

14. A non-transitory computer-readable recording medium storing a program that causes, by a computer, a substrate processing apparatus to perform:

(a) placing a substrate in a process chamber;

(b) supplying a process gas containing a compound capable of reacting with a metal into the process chamber and exhausting an inner atmosphere of the process chamber by: a common exhaust piping in communication with the process chamber; a first exhaust piping made of a resin incapable of reacting with the compound and whose one end is connected to the common exhaust piping via a first valve and a first pressure adjusting valve; and a first exhauster connected to the first exhaust piping and configured to exhaust an inside of the first exhaust piping to a pressure level within a first pressure range; and (c) exhausting the inner atmosphere of the process chamber by: the common exhaust piping; a second exhaust piping made of the metal and whose one end is connected to the common exhaust piping via a second valve and a second pressure adjusting valve; and a second exhauster connected to the second exhaust piping, wherein a portion of the second exhaust piping downstream of the second pressure adjusting valve is made of a metal piping whose inner surface is not surface-treated by the resin.

\* \* \* \* \*